(12) United States Patent
Yang et al.

(10) Patent No.: US 9,985,085 B2
(45) Date of Patent: May 29, 2018

(54) ARRAY SUBSTRATE FOR NARROW FRAME DESIGN, MANUFACTURING METHOD THEREOF AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Wenbin Yang, Beijing (CN); Yanxia Xin, Beijing (CN); Qing Chang, Beijing (CN); Yuedong Shang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days. days.

(21) Appl. No.: 15/120,612

(22) PCT Filed: Sep. 24, 2015

(86) PCT No.: PCT/CN2015/090553
§ 371 (c)(1),
(2) Date: Aug. 22, 2016

(87) PCT Pub. No.: WO2016/192256
PCT Pub. Date: Dec. 8, 2016

(65) Prior Publication Data
US 2017/0154943 A1    Jun. 1, 2017

(30) Foreign Application Priority Data
Jun. 5, 2015    (CN) .......................... 2015 1 0303114

(51) Int. Cl.
*H01L 27/32* (2006.01)
*G09G 3/3208* (2016.01)

(52) U.S. Cl.
CPC ....... *H01L 27/3276* (2013.01); *G09G 3/3208* (2013.01); *H01L 27/3248* (2013.01);
(Continued)

(58) Field of Classification Search
CPC ............ H01L 27/3276; H01L 27/3258; H01L 27/3248; H01L 27/326; H01L 27/3216; H01L 27/3218
See application file for complete search history.

(56) References Cited

U.S. PATENT DOCUMENTS 5,736,815 A * 4/1998 Amemiya ................ H01J 11/12
313/584
2005/0030464 A1    2/2005 Wang
(Continued)

FOREIGN PATENT DOCUMENTS

CN    102183860 A    9/2011
CN    102385200 A    3/2012
(Continued)

OTHER PUBLICATIONS

International Search Report and Written Opinion dated Mar. 15, 2016; PCT/CN2015/090553.
(Continued)

*Primary Examiner* — Victoria K Hall
(74) *Attorney, Agent, or Firm* — Ladas & Parry LLP (57) ABSTRACT

An array substrate, a manufacturing method thereof, and a display device, the array substrate comprises: a base substrate; a plurality of light emitting units disposed on the base substrate to constitute a light emitting region, a display region driving circuit electrically connected to the plurality of light emitting units; and a peripheral circuit disposed at a
(Continued)

periphery of the display region driving circuit, at least one light emitting unit is located on the peripheral circuit, and an orthographic projection of the at least one light emitting unit on the base substrate and an orthographic projection of the peripheral circuit on the base substrate have an overlapping portion there-between. The array substrate can realize a narrow frame design.

18 Claims, 6 Drawing Sheets

(52) U.S. Cl.
CPC .... *H01L 27/3258* (2013.01); *H01L 2227/323* (2013.01); *H01L 2251/5315* (2013.01)

(56) References Cited

U.S. PATENT DOCUMENTS

| | | | |
|---|---|---|---|
| 2013/0027626 A1* | 1/2013 | Namiki | G02F 1/136204 349/43 |
| 2013/0093316 A1* | 4/2013 | Sakaguchi | H01L 51/5212 313/505 |
| 2014/0246668 A1 | 9/2014 | Shimomura et al. | |
| 2015/0243720 A1* | 8/2015 | Kwon | H01L 27/1248 257/40 |
| 2016/0190180 A1* | 6/2016 | Ma | H01L 27/124 257/40 |

FOREIGN PATENT DOCUMENTS

| | | |
|---|---|---|
| CN | 102640200 A | 8/2012 |
| CN | 102760010 A | 10/2012 |
| CN | 102903732 A | 1/2013 |
| CN | 103217843 A | 7/2013 |
| CN | 203150553 U | 8/2013 |
| CN | 103926722 A | 7/2014 |
| CN | 104253147 A | 12/2014 |
| CN | 104600200 A | 5/2015 |
| CN | 104867450 A | 8/2015 |
| JP | 2004-200034 A | 7/2004 |

OTHER PUBLICATIONS

First Chinese Office Action dated Nov. 28, 2016; Appln. No. 201510303114.8.
The Second Chinese Office Action dated May 24, 2017; Appln. No. 201510303114.8.

* cited by examiner (Prior Art)
Fig.1a (Prior Art)
Fig.1b

ARRAY SUBSTRATE FOR NARROW FRAME DESIGN, MANUFACTURING METHOD THEREOF AND DISPLAY DEVICE

TECHNICAL FIELD

Embodiments of the present invention relate to an array substrate, a manufacturing method thereof, and a display device.

BACKGROUND

Organic light-emitting diode (OLED) display technology is a technology which utilizes a reversible color change generated by organic semiconductor materials driven by current to realize display. OLED has many advantages such as light weight, thin thickness, low power consumption, high contrast ratio and a capacity of flexible display, thus, the OLED display technology is regarded as the most proposed new-generation display technology.

According to driving modes, the OLED display technology comprises passive matrix organic light emitting diode (PMOLED) display technology and active matrix organic light emitting diode (AMOLED) display technology. Generally, an array substrate used for PMOLED display requires an external driving circuit (for example, an array substrate row driving circuit), and the array substrate used for AMOLED display is provided with driving circuits such as scanning driving circuit and data driving circuit.

At present, the AMOLED display can be implemented mainly by ways comprising using a low temperature polysilicon (LTPS) back plate mainly applied for small-sized panels (for example, cell phone and the like) in combination with a fine metal mask (FMM Mask), and using an oxide semiconductor back plate mainly applied for large-scaled panels (for example, displayer, television and the like) in combination with WOLED and color filters.

SUMMARY

At least one embodiment of the present invention provides an array substrate, a manufacturing method thereof, and a display device, which takes full advantage of a space of a peripheral circuit region to enlarge a scope of a display region and realize a narrow frame design.

At least one embodiment of the present invention provides an array substrate, which comprises: a base substrate; a plurality of light emitting units disposed on the base substrate to constitute a light emitting region; a display region driving circuit disposed on the base substrate and electrically connected to the plurality of light emitting units so as to drive the plurality of light emitting units; and a peripheral circuit disposed on the base substrate and disposed at a periphery of the display region driving circuit, wherein at least one light emitting unit is located on the peripheral circuit, and an orthographic projection of the at least one light emitting unit on the base substrate and an orthographic projection of the peripheral circuit on the base substrate have an overlapping portion there-between.

At least one embodiment of the present invention further provides a display device, which comprises the abovementioned array substrate.

At least one embodiment of the present invention further provides a manufacturing method of an array substrate, which comprises: forming a display region driving circuit and a peripheral circuit disposed at a periphery of the display region driving circuit on the base substrate; and forming a plurality of light emitting units on the base substrate to constitute a light emitting region electrically connected to the display region driving circuit. In the manufacturing method, the display region driving circuit is configured to drive the plurality of light emitting units, at least one light emitting unit is located on the peripheral circuit, and an orthographic projection of the at least one light emitting unit on the base substrate and an orthographic projection of the peripheral circuit on the base substrate have an overlapping portion there-between.

BRIEF DESCRIPTION OF THE DRAWINGS

In order to illustrate the technical solutions in the embodiments of the present disclosure more clearly, hereinafter, the drawings of the embodiments will be described briefly. Obviously, the drawings described below are only some embodiments of the present disclosure, and not the limitations of the present disclosure.

FIG. 1c is a schematic diagram illustrating a relation between a region occupied by light emitting units and a region occupied by a display region driving circuit in the display device illustrated in FIG. 1a;

DETAILED DESCRIPTION

In order to make the purposes, technical features and advantages of the embodiments of the present disclosure more obvious and understandable, hereafter, the technical solutions in the embodiments of the present disclosure will be clearly, completely described with reference to the drawings in the embodiments of the present disclosure. Obviously, the embodiments described are only a part of the embodiments, not all embodiments. Based on the embodiments in the present disclosure, all other embodiments obtained by one skilled in the art without paying out inventive labor are within the protection scope of the present disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
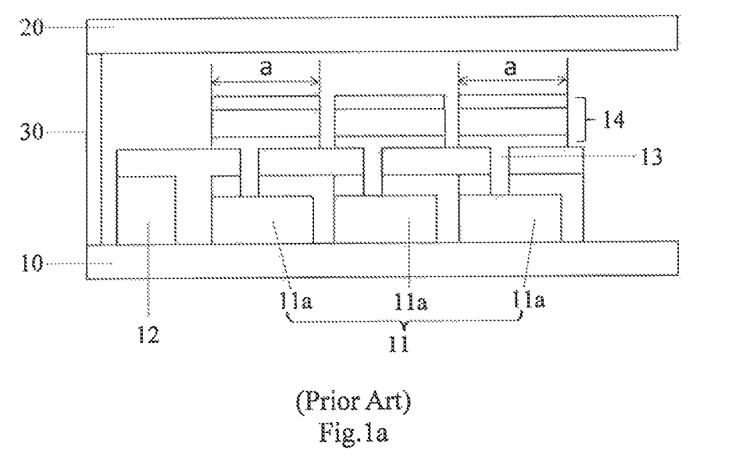
FIG. 1a is a schematic diagram illustrating a partial cross-section of a display device.

FIG. 1a is a schematic diagram illustrating a partial cross-section of a display device. As illustrated in FIG. 1a, the display device comprises a lower substrate 10 and an upper substrate 20 which are disposed opposite to each other, and a sealing structure 30 configured to seal and connect the lower substrate 10 with the upper substrate 20. The lower substrate 10 is provided with a plurality of light emitting units 14 disposed in parallel to each other and a back plate circuit (i.e., a circuit disposed on the lower substrate 10) disposed under the plurality of light emitting units 14; the plurality of light emitting units 14 constitute a display region, as indicated by a wireframe A in FIG. 1b; a region occupied by the back plate circuit is indicated by a wireframe B in FIG. 1b, the back plate circuit can comprise a display region driving circuit 11 configured to drive the plurality of light emitting units, and a peripheral circuit 12 disposed at a periphery of the display region driving circuit 11. The display region driving circuit 11 can comprise driving circuit units 11a in one-to-one correspondence with the plurality of light emitting units 14; the peripheral circuit 12 is disposed at an inner side of the scaling structure 30 and can comprise a scanning driving circuit (for example, comprising a plurality of array substrate row driving circuit units), a data driving circuit, an electrostatic discharge circuit or the like. Each of the light emitting units 14 comprises a light emitting layer and electrodes disposed at two sides of the light emitting layer.

Figure 1B:
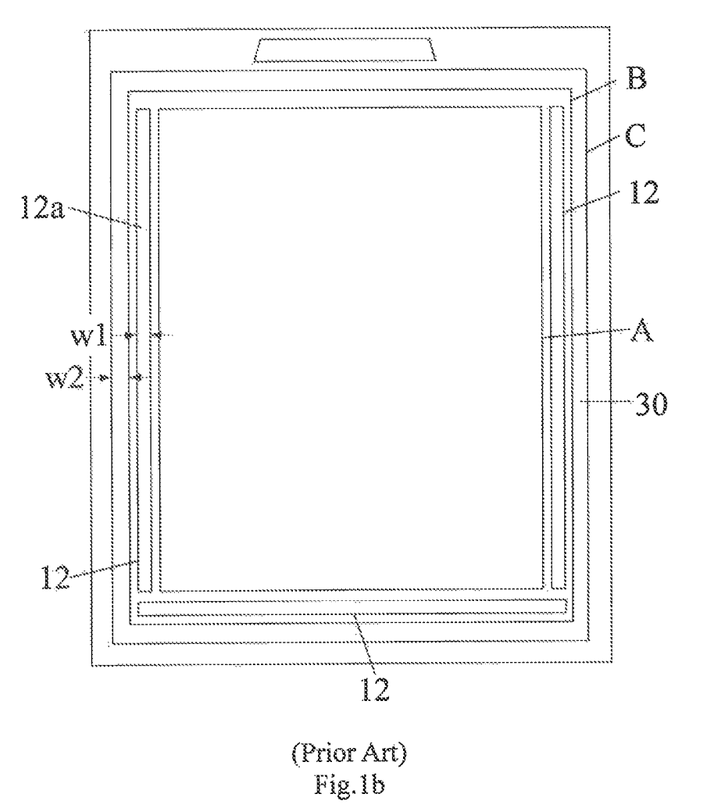
FIG. 1b is a plan view of a display device.

A manufacturing process of the display device illustrated in FIGS. 1a and 1b can comprise: after forming a back plate circuit (comprising a display region driving circuit 11 and a peripheral circuit 12), respectively manufacturing lower electrodes (for example, anodes) at positions corresponding to the driving circuit units 11a respectively on the back plate circuit, then sequentially forming a light emitting layer 14 and an upper electrode (for example, a cathode) of the light emitting unit 14 on each of the lower electrodes.

Figure 1C:
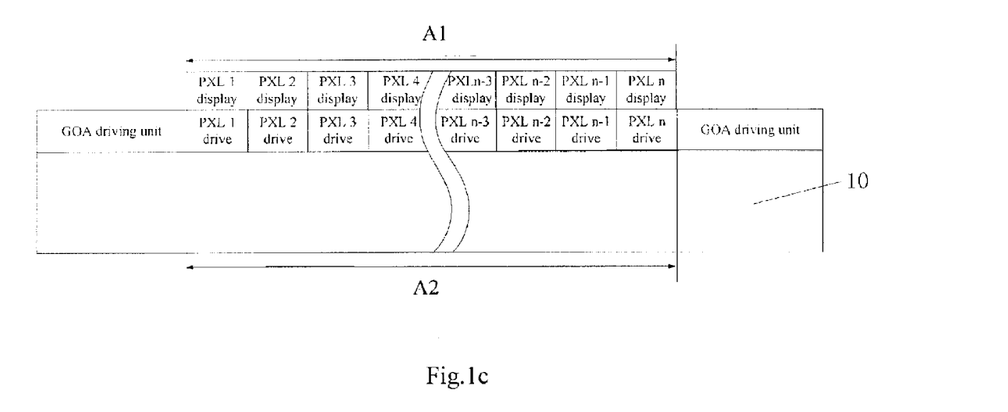

As illustrated in FIG. 1c, in a display device manufactured by the abovementioned method, an orthographic projection of a region A1 occupied by display units (i.e., the light emitting units) of pixels (PXL 1, PXL 2, . . . , PXL n) (i.e., a region surrounded by the outermost light emitting units, that is, a display region indicated by the wireframe A in FIG. 1b) and a region A2 occupied by driving circuit units corresponding to the pixels (i.e., a region surrounded by the outermost driving circuit units, that is, a region occupied by the display region driving circuit 11) are substantially the same on the lower substrate 10.

In FIG. 1b, a region between wireframes B and C represents a region where the sealing structure 30 is located. The position where the peripheral circuit 12 is located in FIG. 1b is illustrated by way of example only. The peripheral circuit 12 can be disposed at at least one side of the display region driving circuit 11, i.e., at a position where at least one side of the display device is disposed.

In the research, the inventor, of the present application notices that: the abovementioned design in which the lower electrode of each of the light emitting units is disposed at a position exactly corresponding to the driving circuit unit corresponding to the light emitting unit follows a design theory of a liquid crystal display (LCD), and goes against realizing a narrow frame design or the like. However, LCD requires a backlight source to provide light, while the light emitting units have self-luminous characteristics themselves, thus the display region driving circuit disposed under the lower electrode of OLED does not require an uniform design similar to that of LCD, i.e., it is not necessary to dispose each pixel driving circuit (i.e., each driving circuit unit) right below the lower electrode of the corresponding light emitting unit.

Hereinafter, the embodiments of the present disclosure will be described in details with reference to the accompanying drawings in which thicknesses and shapes of films and layers do not reflect the real proportion but merely exemplarily illustrate the contents of the embodiments of the present invention.

Figure 2A:
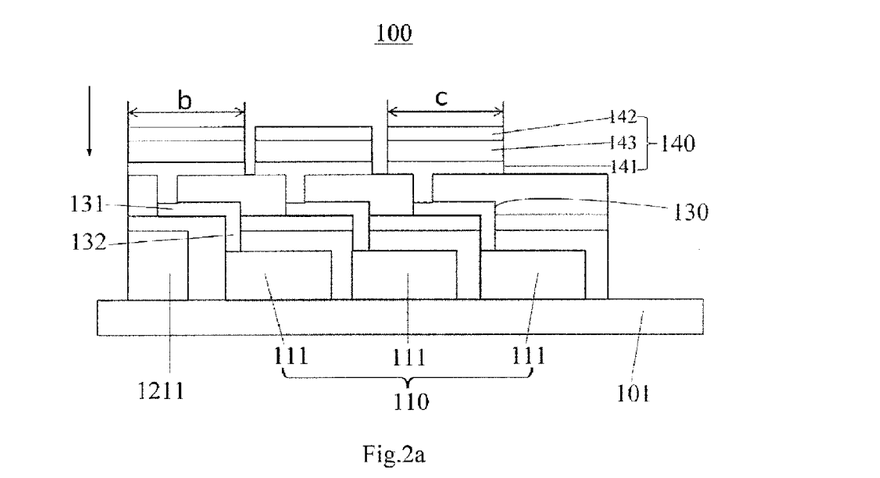
FIG. 2a is a schematic diagram illustrating a partial cross-section of an array substrate provided by the embodiments of the present invention.
Figure 2B:
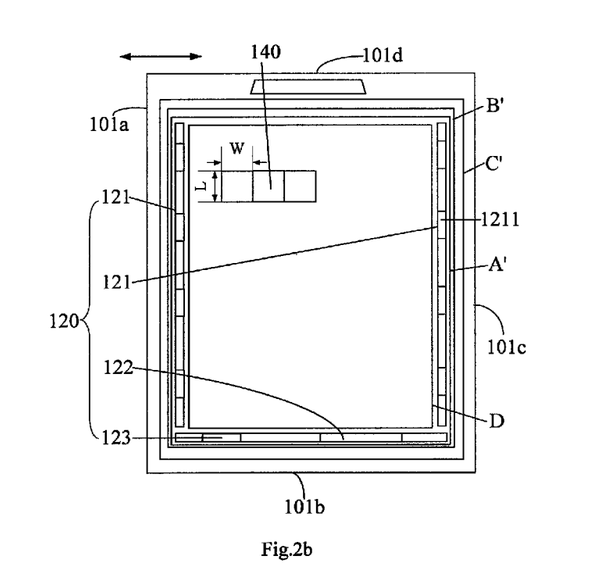
FIG. 2b is a plan view of an array substrate provided by the embodiments of the present invention.

As illustrated by FIG. 2a and FIG. 2b, at least one embodiment of the present invention provides an array substrate 100, which comprises: a base substrate 101; a plurality of light emitting units 140 disposed in parallel to each other on the base substrate 101, the plurality of light emitting units 140 constitute a light emitting region (for example, a region indicated by a wireframe A' in FIG. 2b); a display region driving circuit 110 disposed on the base substrate 101 and electrically connected to the plurality of light emitting units 140 so as to drive the plurality of light emitting units 140; and a peripheral circuit 120 (for example, an array substrate row driving circuit unit 1211) disposed at a periphery of the display region driving circuit 110 on the base substrate 101. In the array substrate 100, at least one light emitting unit 140 is located on the peripheral circuit 120, and an orthographic projection of the at least one light emitting unit 140 on the base substrate 101 and an orthographic projection of the peripheral circuit 120 on the base substrate 101 have an overlapping portion there-between.

An orthographic projection refers to a projection generated by projection lines (a direction of the projection lines is illustrated by the arrows in FIG. 2a) which are parallel to each other and vertical to a projection surface (a plane where the base substrate 101 is located).

The embodiments of the present invention allow at least a part of the light emitting units to be overlapped with the peripheral circuit, i.e., the orthographic projections on the base substrate have an overlapping portion, which can utilize advantages of self-luminous characteristics of OLED or LED light emitting units more efficiently and also can take full advantage of the space of the peripheral circuit region efficiently as compared with the case where the light emitting units are respectively disposed right above the corresponding driving circuit units and do not have an overlapping portion with the peripheral circuit; so as to enlarge the scope of the display region and realize a narrow frame design.

For example, the abovementioned plurality of light emitting units 140 can be disposed in parallel to each other, but the embodiments of the present invention are not limited thereto; the display region driving circuit 110 comprises a plurality of driving circuit units 111 which are disposed in parallel to each other and respectively corresponding to the plurality of light emitting units 140, and the plurality of light emitting units 140 are disposed on the plurality of driving circuit units 111. Each of the driving circuit units 111 mainly has two functions of serving as a switch for the corresponding light emitting unit and continuously providing current to guarantee that each pixel can emit light continuously after an addressing period, i.e., performing a driving process. For example, each driving circuit unit 111 can comprise a capacitor and a transistor, for example, a MOS transistor (Metal-oxide-semiconductor field effect transistor) which is electrically connected to the corresponding light emitting unit.

For example, the light emitting units 140 can be OLED devices, LED devices or the like. Take the case where the light emitting units are OLED devices as an example, each of the light emitting units 140 can comprise an organic function layer as well as an anode and a cathode which are disposed at two sides of the organic function layer respectively. For example, as illustrated by FIG. 2a, each of the light emitting units 140 comprises a first electrode 141 close to a corresponding driving circuit unit 111, a second electrode 142 away from the corresponding driving circuit unit 111, and a light emitting layer 143 disposed between the first electrode 141 and the second electrode 142. The first electrode 141 is an anode and the second electrode 142 is a cathode, or, the first electrode 141 is a cathode and the second electrode 142 is an anode.

Generally, a material of the cathode of the light emitting unit can be a metal with low work function, such as: Li, K, Al, etc.; or, the material of the cathode of the light emitting unit can adopt an alloy of a metal with low work function and a metal with corrosion resistant characteristics, such as: an alloy of Mg/Ag (Ag plays a role of reflecting, adjusting the work function and stabilizing Mg), or an alloy of Ca/Ag, etc, in order to overcome the problem of high chemical activity of the metal with low work function. For example, a cathode protection layer (CPL) can be deposited on the cathode by using an open mask, so as to protect the whole device from corrosion and oxidation.

Generally, the anode of the light emitting unit can adopt a material with good conductivity and light transmission, for example, a transparent conductive oxide such as ITO (Indium Tin Oxide), a multi-layered structure such as a composite layer of ITO/Ag/ITO, or other metal materials with high work function.

Because at least a part of the light emitting units 140 is disposed on the peripheral circuit and vertically overlapped with the peripheral circuit, in order to avoid the peripheral circuit affecting the light emitted from the light emitting units 140 which are overlapped with the peripheral circuit, in at least one embodiment, the light emitting unit 140 can adopt a top light emitting mode, i.e., the light generated by the light emitting layer of the light emitting unit is emitted from a top of the light emitting unit. For example, a reflective layer can be disposed at the layer where the first electrode 141 of the light emitting unit 140 is located, such that the light emitted from a bottom of the light emitting unit 140 can be reflected and then emit from the top of the light emitting unit 140. Implementations of the abovementioned top light emitting mode are not particularly defined in the embodiments of the present invention, as long as the light emitting units can realize the top light emitting mode.

As illustrated by FIG. 2b, the array substrate 100 can be provided with a scanning driving circuit 121 and a data driving circuit 122 which are located at a periphery of the display region driving circuit; the scanning driving circuit 121 is configured to generate a scanning signal and provide the scanning signal to the gate lines to sequentially turn on each row of pixels (not illustrated); the data driving circuit 122 is configured to perform a serial to parallel conversion of image signals and provide proper data signals to the data lines so as to realize display. In addition, the array substrate 100 can also be provided with an electrostatic discharge circuit 123 (ESD circuit) which is located at the periphery of the display region driving circuit 110 of the light emitting units 140, and is configured to promptly release static electricity on the array substrate 100 or take it away from the array substrate 100.

In at least one embodiment of the present invention, as illustrated by FIG. 2b, the abovementioned peripheral circuit overlapped with at least one light emitting unit 140 can comprise at least one or more selected from a group consisting of a scanning driving circuit 121, a data driving circuit 122 and an electrostatic discharge circuit 123.

It shall be noted that, FIG. 2b is merely provided for exemplary illustration, and the embodiments of the present invention are not limitative thereto. For example, the periphery of the display region driving circuit provided with a peripheral circuit 120 can be a periphery of at least one side of the display region driving circuit, i.e., a region where at least one edge of the array substrate is located.

Figure 2C:
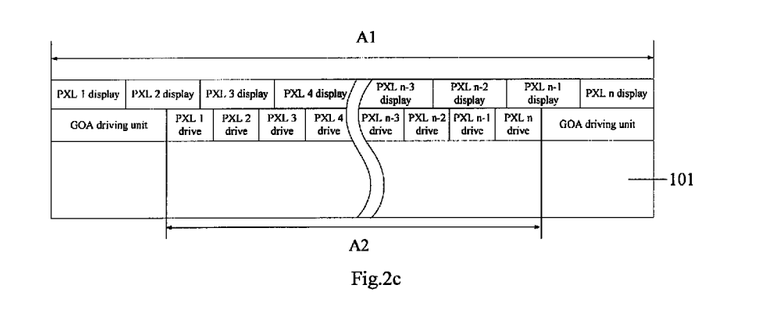
FIG. 2c is a schematic diagram illustrating a relation between a region occupied by light emitting units and a region occupied by a display region driving circuit in an array substrate provided by the embodiments of the present invention.

For example, an effect diagram of an array substrate provided by the embodiments of the present invention can be illustrated by FIGS. 2b and 2c. As illustrated by FIG. 2b and FIG. 2c, the region A1 occupied by the display units (i.e., light emitting units) of the pixels (PXL1, PXL2, . . . , PXLn) (i.e., a region surrounded by the outermost light emitting units, also referred to as a light emitting region, as indicated by the wireframe A' in FIG. 2b) can be larger than the region A2 occupied by the driving circuit units corresponding to the pixels (i.e., a region surrounded by the outermost driving circuit units, also referred to as a region occupied by the display region driving circuit 110, as indicated by a wireframe D in FIG. 2b), thus the array substrate provided by the embodiments of the present invention can drive a relatively large display region by utilizing a relatively small display region driving circuit region.

FIG. 2b is described with reference to the case where the scanning driving circuit 121, the data driving circuit 122 and the electrostatic discharge circuit 123 in the peripheral circuit region are all covered by the display region as an example, although these peripheral circuits can also be partially overlapped with the display region. A region between the wireframes B' and C' in FIG. 2b is a region to be provided with a sealing structure upon the array substrate and the opposite substrate are disposed in opposite to each other to from a display panel (B' represents a position where an inner wall of the sealing structure is located, C' represents a position where an outer wall of the sealing structure is located), the region can be referred to as a sealing region and the peripheral circuit 120 is disposed at an inner side of the sealing region.

GOA (Gate Driver on Array) circuit technology is a conventional scanning driving circuit technology applied in the existing liquid crystal display devices. In the technology, the scanning driving circuit is manufactured directly on the array substrate, so as to save a space of the peripheral wiring and reduce costs. Generally, a GOA circuit (array substrate row driving circuit) comprises a plurality of array substrate row driving circuit units (GOA circuit units), each of the GOA circuit units has an output terminal connected to a gate line which is connected to a row of pixels in the display region, i.e., each of the GOA circuit units is corresponding to a row of pixels; besides, the output terminal of each of the GOA circuit units is further connected to an input terminal of a next GOA circuit unit so as to switch on the next GOA circuit unit.

The array substrate 100 provided by at least one embodiment of the present invention can adopt GOA circuit technology. For example, as illustrated by FIG. 2a and FIG. 2b, the scanning driving circuit 121 comprises a plurality of GOA circuit units 1211, at least one light emitting unit 140 can be located on the at least one GOA circuit unit 1211, and an orthographic projection of the at least one light emitting unit 140 on the base substrate 101 and an orthographic projection of the at least one GOA circuit unit 1211 on the bases substrate 101 respectively have an overlapping portion there-between.

Generally, in the case illustrated by FIG. 1a-FIG. 1b, a width w1 of the GOA circuit region 12a (as illustrated by FIG. 1b) can reach 400-500 μm, while a packaging width w2 of the sealing structure 30 is about 700 μm, further taking a distance of the GOA circuit region and the sealing structure 30 respectively from the display region driving circuit 11 into account, a width of the whole frame is about 1.5 mm. In the embodiments of the present invention, when the scanning driving circuit 121 adopts GOA circuit technology, the scope of the display region can be effectively enlarged by covering the GOA circuit with the light emitting units so as to realize a narrow frame design. For example, along a width direction (as illustrated by the arrow in FIG. 2b) of the GOA region (i.e., a region where the scanning driving circuit 121 is located), the light emitting units can completely cover the GOA region; in such case, the width of the frame can be reduced by 500-600 μm, and the width of the frame can be reduced by about ⅓.

FIG. 2b is described with reference to the case where the scanning driving circuit 121 (for example, comprising a plurality of GOA circuit units 1211 which are only illustrated as 8 in FIG. 2b) is disposed at side edges 101a and 101c of the array substrate, and the ESD circuit 123 and the data driving circuit 122 are disposed at a bottom edge 10b of the array substrate as an example. The embodiments of the present invention are not limited thereto. For example, the GOA circuit unit can be disposed at the bottom edge 101b of the array substrate, and the ESD circuit is disposed at the side edges 101a and 101c or the top edge 101d of the array substrate. Generally, a region where the top edge 101d of the array substrate is located can be provided with an IC (integrated circuit) and a flexible printed circuit board (FPC). Certainly, a region where the top edge 101d of the array substrate is located can also be provided with a peripheral circuit such as ESD circuit, and the peripheral circuit such as ESD circuit is disposed at an inner side of the sealing region (i.e., inner side of the wireframe B').

In at least one embodiment, in order for the peripheral circuit to be overlapped with at least one light emitting unit, the following methods can be adopted and will be described in detail hereinafter.

In order for convenience of description, the following are described with reference to the case illustrated in FIG. 1a where a size of each of the light emitting units is a as an example.

The first method: as compared with the situation illustrated by FIG. 1a, in the array substrate provided by the embodiments of the present invention, the size of the light emitting unit close to an edge portion of the array substrate in the light emitting unit array can be increased.

For example, in the procedure for manufacturing a light emitting unit, a lower electrode of the light emitting unit close to the edge portion of the array substrate can be extended to a region corresponding to the peripheral circuit, and structures such as the light emitting layer and the upper electrode formed on the lower electrode are correspondingly extended to the region corresponding to the peripheral region so that the peripheral circuit is overlapped with the light emitting unit. In this case, an area of the light emitting unit close to the edge portion of the array substrate among the plurality of light emitting units is larger than that of the light emitting unit located at a middle portion of the array substrate. For example, as illustrated by FIG. 2a, the size b of the light emitting unit close to the edge portion of the array substrate can be larger than the size c of the light emitting unit located at the middle portion of the array substrate, while the size c of the light emitting unit located at the middle portion can stay the original size, i.e., b>c=a.

The second method: as compared with the case illustrated by FIG. 1a, in the array substrate provided by the embodiments of the present invention, a size of the light emitting unit close to the edge portion of the array substrate and a part or all the light emitting units located at the middle portion of the array substrate can be increased.

For example, the sizes of all of the light emitting units on the array substrate are enlarged by the same degrees, i.e., the areas of the light emitting units in the array substrate are equal to each other, and the light emitting unit close to the edge portion of the array substrate is extended to the peripheral region, so that the peripheral circuit is overlapped with the light emitting unit; in this case, b=c>a.

For example, the areas of the plurality of light emitting units on the array substrate can be gradually increased from the middle portion to the edge portion, in this case, for example, b>c>a. For example, the area of the light emitting unit can be increased from the middle portion to the edge portion at an arithmetic sequence.

Compared with the first method, the areas of the light emitting units in the second method are equal with each other or are gradually changed, thus the second method provides a better display effect.

It shall be noted that, firstly, FIG. 2a is described with reference to the case where the areas of all the light emitting units on the array substrate are equal (i.e., b=c).

Second, in the embodiments of the present invention, the area of the light emitting unit refers to an area of a surface of the light emitting unit which is substantially parallel to the base substrate (for example, an area of the light emitting layer). For example, take the light emitting units 140 illustrated by FIG. 2b as an example (FIG. 2b merely illustrates three light emitting units), the area of the light emitting unit 140 equals to a length L of the first edge multiplying a length W of the second edge. The surface of each of the light emitting units substantially parallel to the base substrate can have a shape of square, rectangle or hexagon, etc. FIG. 2b is only provided to exemplarily illustrate the area of the light emitting unit without limiting the protection scope of the present invention.

Third, the sizes b and c of the abovementioned light emitting units can be a size (for example, W) along a left-right direction of the array substrate illustrated by FIG. 2b (i.e., a direction parallel to the bottom edge 101b or the top edge 101d of the array substrate), or can be a size (for example, L) along an up-down direction (i.e., a direction parallel to the side edges 101a or 101c of the array substrate), depending on the position of the peripheral circuit which is overlapped with the light emitting units; for example, if the light emitting units are overlapped with the peripheral circuit disposed at the region where the side edges 101a and 101c are located, the sizes b and c of the abovementioned light emitting units are the sizes along the left-right direction of the array substrate, for example, the size W as illustrated in FIG. 2b.

Because the light emitting units 140 adopt self-luminous devices such as OLED or LED, it is not necessary to dispose each driving circuit unit 111 in a region covered by the corresponding light emitting unit 140. Therefore, in at least one embodiment, as illustrated by FIG. 2a and FIG. 2c, an orthographic projection of the at least one light emitting unit 140 on the base substrate 101 have an overlapping portion with orthographic projections of at least two driving circuit units 111 on the base substrate 101, respectively.

In the case illustrated by FIG. 1a, each driving circuit unit 11a is disposed right below the corresponding light emitting unit 14, thus a lead wire 13 for connecting the light emitting unit 14 and the corresponding driving circuit unit 11a can be formed in a patterning process of forming the lower electrode of each light emitting unit 14 in order to reduce processes; as a result, the lead wire 13 generally extends along a direction vertical to the lower substrate 20.

In the embodiments of the present invention, the region occupied by at least a part of the light emitting units 140 may not overlap with the region occupied by the corresponding driving circuit unit 111, in this case, as illustrated by FIG. 2a, the light emitting unit 140 and the corresponding driving circuit unit 11 can be electrically connected through a bent lead wire 130, so as to more flexibly dispose the light emitting units which are overlapped with the peripheral circuit, thereby further enabling the light emitting units to cover more circuits in the peripheral circuit.

For example, the bent lead wire can be manufactured by additionally adding a patterning process, that is to say, as illustrated by FIG. 2a, the lead wires 130 respectively connecting the light emitting units 140 and the corresponding driving circuit units 111 can be manufactured in different patterning processes with the first electrodes 141 of the light emitting units 140.

Because the lead wires 130 can be manufactured in patterning process different from that of the first electrodes, in some embodiments, the material of the lead wire 130 can be different from the material of the first electrode 141. For example, the lead wire 130 can be manufactured with a metal with low electrical resistance (for example, Al and Ag).

For example, the bent lead wire 130 electrically connecting each of the light emitting units overlapped with the peripheral circuit and the corresponding driving circuit unit can comprise a portion extending along a direction parallel to the base substrate and electrically connected to the corresponding light emitting unit. For example, the bent lead wire 130 can further comprise a portion extending along a direction vertical to the base substrate and electrically connected to the driving circuit unit. For example, the lead wire 130 can adopt a shape as illustrated by FIG. 2a, i.e., the lead wire 130 can comprise a first portion 131 and a second portion 132 which are connected with each other, wherein the first portion 131 extends along a direction substantially parallel to the base substrate 101 and is connected to the corresponding light emitting unit 140, the second portion 132 extends along a direction substantially vertical to the base substrate 101 and is connected to the corresponding driving circuit unit 111.

The array substrate provided by the embodiments of the present invention can adopt an active matrix mode, for example, the array substrate is an AMOLED array substrate.

At least one embodiment of the present invention further provides a display device, which comprises the array substrate 100 provided by any one of the abovementioned embodiments.

Figure 3:
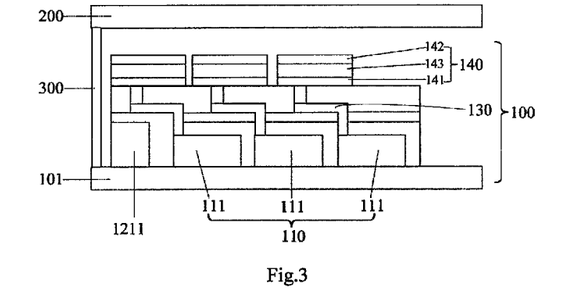
FIG. 3 is a schematic diagram illustrating a partial cross-section of a display device provided by the embodiments of the present invention.

For example, as illustrated by FIG. 3, the display device can comprise an array substrate 100 and an opposed substrate 200 which are disposed in opposite to each other; and a sealing structure 300 configured to seal and connect the array substrate 100 with the opposed substrate 200. For example, the array substrate 100 can be provided with an OLED array or a LED array; for example, the opposed substrate 200 can be a glass substrate, a quartz substrate, a plastic substrate or the like; for example, the sealing structure 300 can be a thin glass film formed by firing glass frit.

The display device provided by the embodiments of the present invention can be: an electronic paper, a display panel (For example, an OLED panel or a LED panel), a cell phone, a tablet computer, a television, a displayer, a notebook computer, a digital frame, a navigator or any other product or component with display function.

In the embodiments of the present invention, the light emitting region constituted by a plurality of light emitting units which are disposed in parallel to each other in the display device can be the same with the display region of the display device (for example, when all the light emitting units are used for display); or, the light emitting region and display region can be different (for example, when the light emitted from the plurality of light emitting units is used as the backlight of the display device).

At least one embodiment of the present invention further provides a manufacturing method of an array substrate, the method comprises: forming a display region driving circuit and a peripheral circuit located at a periphery of the display region driving circuit on a base substrate; and forming a plurality of light emitting units on the base substrate; in the method, the plurality of light emitting units constitute a light emitting region and is electrically connected to the display region driving circuit, the display region driving circuit is configured to drive the plurality of light emitting units, at least one light emitting unit is located on the peripheral circuit, and an orthographic projection of the at least one light emitting unit on the base substrate and an orthographic projection of the peripheral circuit on the base substrate have an overlapping portion there-between.

For example, the peripheral circuit can comprise at least one selected from or a combination of more than one selected from a group consisting of a scanning driving circuit, a data driving circuit and an electrostatic discharge circuit.

For example, the scanning driving circuit can comprise a plurality of array substrate row driving circuit units, at least one light emitting unit is located on at least one array substrate row driving unit, and an orthographic projection of the at least one array substrate row driving unit on the base substrate and an orthographic projection of the at least light emitting unit on the base substrate have an overlapping portion there-between.

For example, forming the display region driving circuit comprises: forming a plurality of driving circuit units disposed in parallel to each other.

For example, forming the display region driving circuit comprises: forming a plurality of driving circuit units disposed in parallel to each other. Forming a plurality of light emitting units comprise: on the plural driving circuit units, forming a plurality of first electrodes corresponding to the plurality of driving circuit units and disposed in parallel to each other; forming light emitting layers respectively on the plural first electrodes; and forming a plurality of second electrodes respectively on the light emitting layers.

For example, after forming the display region driving circuits and the peripheral circuit, forming a first planarization layer to cover the display region driving circuit and the peripheral circuit, and forming first via holes at positions corresponding to the driving circuit units respectively in the first planarization layer so as to expose the driving circuit units; forming lead wires respectively corresponding to the driving circuit units on the first planarization layer, so as to electrically connect the lead wires to the driving circuit units through the first via holes; when forming the first electrodes, electrically connecting the first electrodes to the lead wires in one-to-one correspondence.

For example, before forming a plurality of light emitting units (i.e., before forming the abovementioned plurality of first electrodes), forming a second planarization layer to cover the lead wires, and forming second via holes in the second planarization layer to expose the lead wires, respectively; when forming the abovementioned plurality of first electrodes, electrically connecting the plurality of first electrodes to the corresponding lead wires through the second via holes.

A patterning process refers to a process of forming a predetermined pattern, comprising steps of, for example, coating a photoresist, exposing the photoresist, developing the photoresist, and etching a thin film layer by using a pattern of the photoresist.

For example, the lead wire that connects each light emitting unit whose orthographic projection is overlapped with the orthographic projection of a corresponding peripheral circuit to the corresponding driving circuit unit can comprise a portion extending along a direction parallel to the base substrate and electrically connected to the corresponding light emitting unit.

Hereafter the manufacturing method of an array substrate provided by the embodiments of the present invention will be described in detail.

Figure 4A:
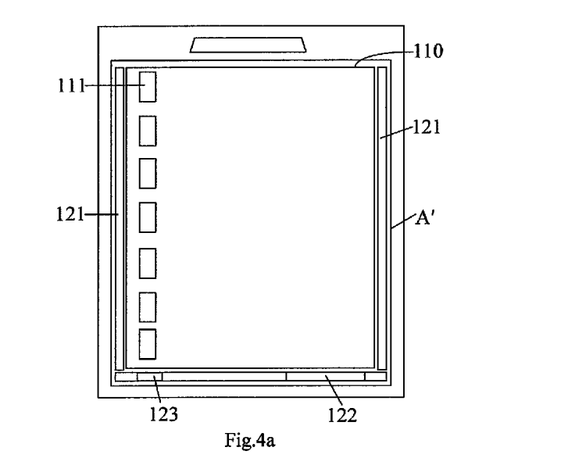
FIG. 4a and FIG. 4b are schematic diagrams illustrating structures obtained after forming a back plate circuit in a manufacturing method of an array substrate provided by the embodiments of the present invention.
Figure 4B:
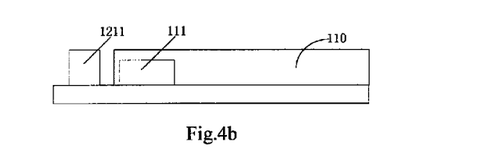

Step 1: as illustrated by FIG. 4a and FIG. 4b, forming a back plate circuit on an array substrate.

The back plate circuit can comprise a structure such as a top gate/bottom gate structure of CMOS/NMOS/PMOS formed of a thin film transistor (for example, a low temperature polysilicon/amorphous silicon/oxide/organic thin film transistor) and other structures extending there-from. For example, the back plate circuit can comprise: a display region driving circuit 110 (FIG. 4b only illustrates a single driving circuit unit 111) configured to be electrically connected to the light emitting units and a peripheral circuit disposed at a periphery of the display region driving circuit 110, and the peripheral circuit can comprise at least one or a combination of more selected from a group consisting of a scanning driving circuit 121 (for example, comprising a plurality of GOA circuit units 1211), a data driving circuit 122 and an electrostatic discharge circuit 123

Figure 5:
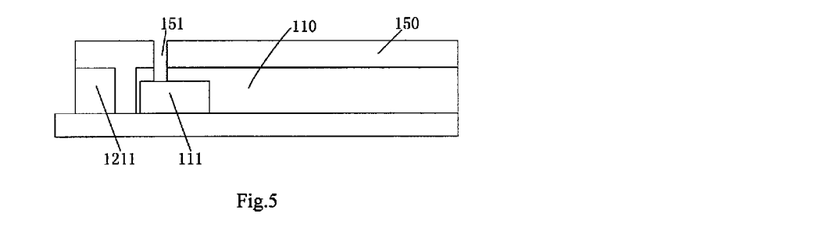
FIG. 5 is a schematic diagram illustrating a structure obtained after forming a first planarization layer in a manufacturing method of an array substrate provided by the embodiments of the present invention.

Step 2: as illustrated by FIG. 5, forming a first planarization layer 150 on the display driving circuit 110 and the peripheral circuit (for example, a GOA circuit unit 1211), and forming a first via hole 151 at a position corresponding to a driving circuit unit 111 to expose the corresponding driving circuit unit 111.

For example, a material of the first planarization layer 150 can be acrylic or other material with high light transmission. For example, the first planarization layer 150 can cover the display region driving circuit 110 and the peripheral circuit, for example, a region covered by the first planarization layer 150 is indicated by a wireframe A' in FIG. 4a.

Figure 6A:
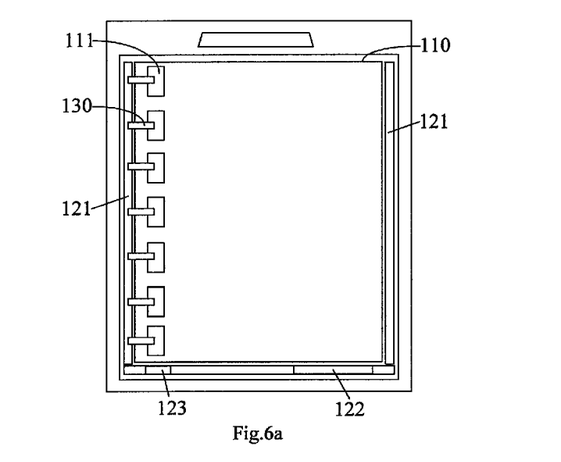
FIG. 6a and FIG. 6b are schematic diagrams illustrating structures obtained after forming a lead wire in a manufacturing method of an array substrate provided by the embodiments of the present invention.
Figure 6B:
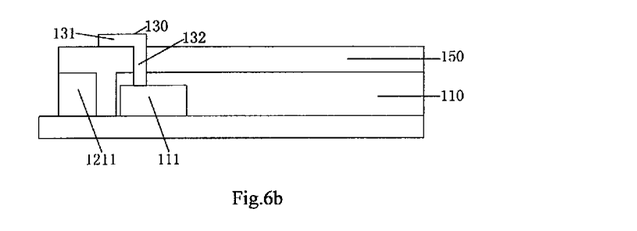

Step 3: as illustrated by FIGS. 6a and 6b, forming a lead wire 130 electrically connected to the driving circuit unit 111 on the first planarization layer 150, the lead wire 130 being electrically connected to the corresponding driving circuit 111 through the first via hole 151.

For example, forming a metal layer (for example, a film layer of a metal with low electrical resistance such as Mo or Ag) on the first planarization layer 150 by using a sputtering method; then forming the lead wire 130 by using exposing and etching processes or forming the lead wire 130 by using an evaporation method and a mask corresponding to a pattern of the lead wire.

In the step, at least a part of the lead wire has a bent shape. For example, the lead wire comprises a first portion 131 and a second portion 132 which are connected to each other, the first portion 131 extends along a direction substantially parallel to the base substrate, and the second portion 132 extends along a direction substantially vertical to the base substrate and is connected to the corresponding driving circuit unit.

Figure 7A:
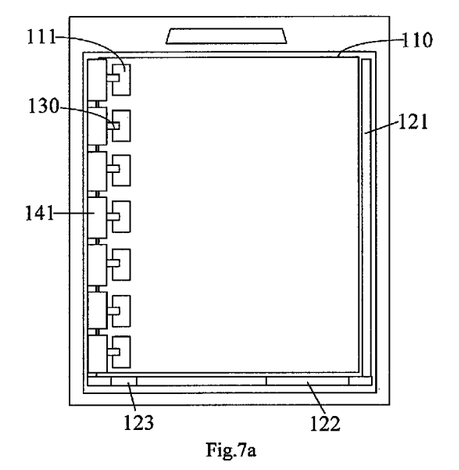
FIG. 7a and FIG. 7b are schematic diagrams illustrating structures obtained after forming a second planarization layer and a first electrode in a manufacturing method of an array substrate provided by the embodiments of the present invention.
Figure 7B:
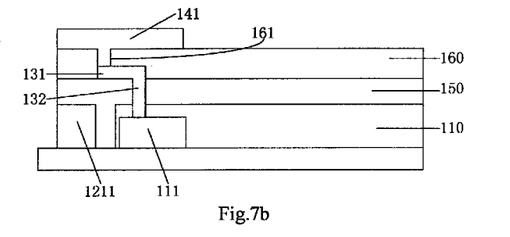

Step 4: as illustrated by FIG. 7a and FIG. 7b, forming a second planarization layer 160 to cover the lead wire 130; forming a second via hole 161 in the second planarization layer 160 to expose the lead wire 130; then forming a first electrode 141 of the light emitting unit on the second planarization layer 160, the first electrode 141 is electrically connected to the corresponding lead wire 130 through the second via hole 161.

For example, the second planarization layer 160 can be formed by a material which is the same with or different from that of the first planarization layer 150, and the specific material can be determined according to the actual requirements.

For example, the first electrode can be an anode of the light emitting unit, and the material thereof can be ITO/Ag/ITO or other metal with high work function. As illustrated by FIG. 7a, the first electrode can cover the peripheral circuit, which is, for example, at least one or more selected from a group consisting of a scanning driving circuit (for example, a GOA circuit unit), a data driving circuit and an electrostatic discharge circuit.

Step 5: as illustrated by FIG. 2a, manufacturing the other structures of the array substrate, for example, a pixel defining layer (not illustrated), a light emitting layer 143 and a second electrode 142 of the light emitting unit, etc.

Taking the case where the light emitting unit is an OLED as an example, the first electrode 141 and the second electrode 142 of the light emitting unit 140 are provided with an organic function layer there-between, the organic function layer can comprise a hole injection layer (HIL), an electron injection layer (EIL), a light emitting layer (EML) 143, an electron transport layer (ETL) and a hole transport layer (HTL). For example, the organic function layer can be manufactured by using a fine metal mask (FMM Mask). A material of the function layer can be selected from conventional materials for those skilled in the art, which are not repeated herein.

For example, the second electrode 142 can be a cathode of the light emitting unit. For example, a material of the cathode can be Mg/Ag, Li, K, Ca/Ag and Al, etc.

For example, the cathode can be provided with a cathode protection layer, which can be deposited on the cathode by using an open mask, for example, so as to protect the whole light emitting device from corrosion and oxidation.

The abovementioned manufacturing method is described with reference to the case where two planarization layers are adopted by way of example, although the embodiments of the present invention can be provided with only one planarization layer (for example, a first planarization layer) or a plurality of planarization layers, without repeating herein.

The foregoing are merely exemplary embodiments of the present invention, but not limitative to the protection scope of the invention. The protection scope of the invention shall be defined by the accompanying claims.

The present disclosure claims the benefits of Chinese patent application No. 201510303114.8, which was filed with the SIPO on Jun. 5, 2015 and is fully incorporated herein by reference as part of this application.

What is claimed is:

1. An array substrate, comprising:
   a base substrate;
   a plurality of light emitting units that are disposed on the base substrate to constitute a light emitting region;
   a display region driving circuit that is disposed on the base substrate and is electrically connected to the plurality of light emitting units to drive the plurality of light emitting units; and
   a peripheral circuit that is disposed on the base substrate and disposed at a periphery of the display region driving circuit,
   wherein at least one light emitting unit is located on the periphery circuit, and an orthographic projection of the at least one light emitting unit on the base substrate and an orthographic projection of the peripheral circuit on the base substrate have an overlapping portion there-between, and
   wherein an area of a light emitting unit close to the peripheral circuit of the array substrate among the plurality of light emitting units is larger than an area of a light emitting unit located at a middle portion of the array substrate among the plurality of light emitting units.

2. The array substrate according to claim 1, wherein the peripheral circuit comprises at least one or more selected from the group consisting of a scanning driving circuit, a data driving circuit and an electrostatic discharge circuit.

3. The array substrate according to claim 2, wherein the scanning driving circuit comprises plurality of array substrate row driving circuit units, at least one light emitting unit is located on at least one array substrate row driving circuit unit, and an orthographic projection of the at least one light emitting unit on the base substrate and an orthographic projection of the at least one array substrate row driving circuit unit on the base substrate have an overlapping portion there-between.

4. The array substrate according to claim 1, wherein the plurality of light emitting units are disposed in rows and columns; the display region driving circuit comprises plurality of driving circuit units, the plurality of driving circuit units disposed in rows and columns and corresponding to the plurality of light emitting units respectively; each light emitting unit of the plurality of light emitting units is located on a respective driving circuit unit of the plurality of driving circuit units.

5. The array substrate according to claim 4, wherein the orthographic projection of the at least one light emitting unit on the base substrate has overlapping portions with orthographic projections of at least two driving circuit units on the base substrate, respectively.

6. The array substrate according to claim 1, wherein the plurality of light emitting units increase in area from the middle portion to the periphery.

7. The array substrate according to claim 4, wherein each of the light emitting units comprises: a first electrode close to a corresponding driving circuit unit; a second electrode away from the corresponding driving circuit unit; and a light emitting layer disposed between the first electrode and the second electrode;
   each light emitting unit of the plurality of light emitting units is electrically connected to the corresponding driving circuit unit of the plurality of driving circuit units though a respective lead wire.

8. The array substrate according to claim 7, wherein each respective lead wire comprises a portion which extends along a direction parallel to the base substrate and is electrically connected to the corresponding light emitting unit.

9. The array substrate according to claim 8, wherein each respective lead wire further comprises a portion which extends along a direction vertical to the base substrate and is electrically connected to the corresponding driving circuit unit.

10. The array substrate according to claim 1, wherein each light emitting unit of the plurality of light emitting units is a top-emission light-emitting unit.

11. A display device, comprising the array substrate according to claim 1.

12. A manufacturing method of an array substrate, comprising:
   forming a display region driving circuit and a peripheral circuit disposed at a periphery of the display region driving circuit, on a base substrate; and
   forming a plurality of light emitting units on the base substrate to constitute a light emitting region electrically connected to the display region driving circuit;
   wherein the display region driving circuit is configured to drive the plurality of light emitting units, at least one light emitting unit is located on the peripheral circuit, and an orthographic projection of the at least one light emitting unit on the base substrate and an orthographic projection of the peripheral circuit on the base substrate have an overlapping portion there-between, and
   wherein an area of a light emitting unit close to the peripheral circuit of the array substrate among the plurality of light emitting units is larger than an area of a light emitting unit located at a middle portion of the array substrate among the plurality of light emitting units.

13. The manufacturing method according to claim 12, wherein the peripheral circuit comprises at least one or more selected from the group consisting of a scanning driving circuit, a data driving circuit and an electrostatic discharge circuit.

14. The manufacturing method according to claim 13, wherein the scanning driving circuit comprises a plurality of array substrate row driving circuit units, the at least one light emitting unit is located on at least one array substrate row driving circuit unit, and the orthographic projection of the at least one light emitting unit on the base substrate and an orthographic projection of the at least one array substrate row driving circuit unit on the base substrate have an overlapping portion there-between.

15. The manufacturing method according to claim 12, wherein
forming the display region driving circuit comprises:
  forming a plurality of driving circuit units disposed in rows and columns;
forming the plurality of light emitting units comprises:
forming a plurality of first electrodes on the plurality of driving circuit units, the plurality of first electrodes being disposed in rows and columns and corresponding to the plurality of driving circuit units, respectively;
forming a light emitting layer of a plurality of light emitting layers on a respective first electrode of the plurality of first electrodes; and
forming a second electrode of a plurality of second electrodes on a respective light emitting layer of the plurality of light emitting layers.

16. The manufacturing method according to claim 15, wherein
upon forming the display region driving circuit and the peripheral circuit, forming a first planarization layer to cover the display region driving circuit and the peripheral circuit, and forming first via holes at positions corresponding to the driving circuit units respectively in the first planarization layer so as to expose the driving circuit units;
forming lead wires corresponding to the driving circuit units respectively on the first planarization layer so that the lead wires are electrically connected to the driving circuit units through the first via holes respectively;
during forming the first electrodes, electrically connecting each first electrode of the plurality of first electrodes to a corresponding lead wire.

17. The manufacturing method according to claim 16, wherein
before forming the plurality of light emitting units, forming a second planarization layer to cover the lead wires, and forming second via holes in the second planarization layer to expose the lead wires respectively,
during forming the plurality of first electrodes, electrically connecting each first electrode of the plurality of first electrodes to a corresponding lead wire through a respective second via hole.

18. The manufacturing method according to claim 16, wherein each of the lead wires in the at least one light emitting unit that is connected to a corresponding driving circuit unit comprises a portion which extends along a direction parallel to the base substrate and is electrically connected to the corresponding light emitting unit.

* * * * *